United States Patent [19]
Cathey et al.

[11] Patent Number: 5,403,435
[45] Date of Patent: Apr. 4, 1995

US005403435A

[54] PROCESS FOR SELECTIVELY ETCHING INTEGRATED CIRCUIT DEVICES HAVING DEEP TRENCHES OR TROUGHS OR ELEVATED FEATURES WITH RE-ENTRANT PROFILES

[75] Inventors: David A. Cathey; J. Brett Rolfson, both of Boise, Id.

[73] Assignee: Micron Technology, Inc., Boise, Id.

[21] Appl. No.: 195,950

[22] Filed: Feb. 14, 1994

Related U.S. Application Data

[63] Continuation-in-part of Ser. No. 84,394, Jun. 29, 1993, Pat. No. 5,358,599, which is a continuation of Ser. No. 824,792, Jan. 23, 1992, Pat. No. 5,223,083.

[51] Int. Cl.⁶ .......................... B44C 1/22; C23F 1/00; H01L 21/44
[52] U.S. Cl. ...................................... 156/643; 156/656; 156/659.1; 156/657; 437/187; 437/203; 437/245
[58] Field of Search ................ 156/643, 650, 651, 652, 156/653, 656, 657, 659.1, 662; 437/48, 52, 187, 203, 245

[56] References Cited
U.S. PATENT DOCUMENTS 5,223,083 6/1993 Cathey et al. ...................... 156/643

Primary Examiner—William Powell
Attorney, Agent, or Firm—Angus C. Fox, III

[57] ABSTRACT

An improved process for selectively etching integrated circuit devices having deep trenches or troughs or elevated features with re-entrant profiles is disclosed. The process is capable of producing photoresist patterns having line and space dimensions which are less than 3 microns. Such patterns may be employed to produce high-resolution etched patterns within the functional layers comprising those circuits. The process proceeds without the formation of unwanted residual photoresist material in deep trenches and troughs and in recesses along the sidewalls of raised features having re-entrant sidewall profiles. No auxiliary, critical-dimension-shrinking etch step is required to remove such residual photoresist in those locations. The process is particularly useful for in-process integrated circuit having either a plurality of elevated features or a plurality of trenches or troughs, in combination with at least one conductivity-providing layer, which covers the raised features or lines the trenches or troughs. The process involves forming an etch mask pattern on the in-process circuit using negative photoresist as the mask material, with the pattern covering certain portions of the conductivity-providing layer and exposing other portions of the conductivity-providing layer. The exposed portions of the conductivity-providing layer are then etched.

24 Claims, 10 Drawing Sheets

PROCESS FOR SELECTIVELY ETCHING INTEGRATED CIRCUIT DEVICES HAVING DEEP TRENCHES OR TROUGHS OR ELEVATED FEATURES WITH RE-ENTRANT PROFILES

This application is a continuation-in-part of application Ser. No. 08/084,394, filed on Jun. 29, 1993, now issued as U.S. Pat. No. 5,358,599, which, in turn, is a continuation of application Ser. No. 07/824,792, filed on Jan. 23, 1992, now issued as U.S. Pat. No. 5,223,083.

FIELD OF THE INVENTION

This invention relates to processes for selectively etching integrated circuit devices and, more particularly, to a process for selectively etching integrated circuit devices having deep trenches, or elevated features with re-entrant profiles.

BACKGROUND OF THE INVENTION

Numerous techniques are known in the art for etching in-process integrated circuits. Wet chemical etches are commonly used when isotropicity is desired. An isotropic etch, by definition, etches in all directions at a relatively even rate. Sputter etching is a process whereby ionized inert atoms, such as argon, are accelerated by an electric field and allowed to collide against a material to be etched, physically dislodging particles therefrom. Sputter etching tends to be unidirectional, or anisotropic, in nature. Reactive ion etching is a process whereby a plasma is created in a reaction chamber by a radio frequency electric field, the plasma containing ions and radicals which are accelerated by the electric field against the material to be etched. The ions and/or radicals react with atoms or molecules within the material to be etched, forming a volatile byproduct which is typically removed from the reaction chamber. Reactive ion etching also tends to be anisotropic in nature. Sputter etching and reactive-ion etching are often combined in a single process.

In order to selectively etch only certain regions of an in-process integrated circuit, an etch mask is employed which protects those regions which are to remain unetched. The etch mask is normally formed from a material that it is relatively impervious to the etching process. Although a polymer resin, known as photoresist, which undergoes deposition, exposure to light (i.e., printing), and development is generally used as the etch mask metal, silicon dioxide, silicon nitride, and other materials may be used in particular etching environments. In any case, a primary mask is made from photoresist.

Two basic types of photoresist have been developed over the years: positive photoresist and negative photoresist. With positive photoresist, the portion thereof that is exposed to light is removed during developing, while with negative photoresist, the portion thereof that is not exposed to light is removed.

During the early stages of the semiconductor industry, negative resist was used almost exclusively. Negative resist is typically manufactured from a radiation-insensitive resin which is extremely soluble in non-polar solvents which are used as developers, and a sensitizer compound which is a photoactive compound. Sensitizer compounds generally comprise 2% to 3% by weight of negative resists. When the sensitizer compound is irradiated with electromagnetic radiation of a particular frequency, an extremely reactive radical is formed which initiates cross-linking of the resin in a three-dimensional framework. The cross-linked resin is insoluble in the developer solvent. Polyvinyl cinnamate was commonly used as a negative resist resin in the 1960's. Quinones, azido compounds, and nitro compounds were commonly used as sensitizers for polyvinyl cinnamate. Nitrobenzene and furfural were successfully used as developer compounds for polyvinyl cinnamate resin. Recently, cyclized polyisoprene polymers have been used as a negative resist resin, and azides have been used in combination therewith as sensitizer compounds. Xylene and benzene function as effective developer compounds for the latter.

Historically, negative resists have been unsuitable for applications requiring line and space dimensions of the resist pattern which are less than 3 $\mu$m. This limitation is discussed in "Silicon Processing For the VLSI Era", Volume 1-Process Technology, S. Wolf and R. N. Tauber (1987), p 420. The major problem is swelling. Even though the developer solvent doesn't dissolve the exposed resist, it is absorbed therein and causes swelling. During subsequent rinse operations, the developer is removed, and the resist shrinks. However, if the resist lines are closer together than 3 $\mu$m, the swelling can cause them to touch. During the subsequent shrinkage process, they may remain stuck together, thereby eliminating the required spacing between lines. Long and narrow resist lines can also become wavy during swelling and, if surface adherence is good, will retain the their waviness even after shrinkage. Furthermore, the resist lines can be pulled loose from the substrate.

Because of the problems associated with negative resists, positive resists have supplanted negative resists for very large scale integration (VLSI) devices. Positive resists are based on a totally different chemistry from that employed with negative resists. Positive resists also utilize a sensitizer, but the resin does not interact with the sensitizer. The change in solubility of the resist is due to the presence of sensitizer. When exposed to an electromagnetic radiation source of an appropriate wavelength, the sensitizer breaks down, and the resist material becomes solubilized so that it is easily removed by a developer solution. Unexposed regions of the resist film are not permeated by developer compound. Thus, positive resist patterns closely retain the size that they possessed after exposure, even after being immersed in developer. Since the presence of the sensitizer inhibits dissolution, it is often referred to an inhibitor. Sensitizers may comprise up to 20% by weight of positive resists. The most common sensitizer for positive resists is naphthoquinone diazide. Ethylene glycol monomethyl ether can be employed as a carrier solvent, while diluents may include butyl and cellusolve acetate. Positive resists typically have a broader optical sensitivity than negative resists, and can utilize the output of a relatively conventional UV lamp. In addition to dimensional stability, positive resist films exhibit improved dry etch resistance and better thermal stability compared to negative resists.

In spite of the many advantages of positive resist films as compared to negative resist films, there is one particular problem related to the use of positive resist that can be fatal to integrated circuits. Raised features often acquire unwanted re-entrant profiles during processing. Several known mechanisms will produce re-entrant profiles on multi-layer features. One common mechanism often manifests itself during an etch of sequentially deposited layers. If one or more underlying layers etch at a faster rate than the top-most layer, a recessed or re-entrant profile will result. Another common mechanism involves chemical vapor deposition (CVD). For certain CVD reactions, as material deposits on a rectangular, raised feature, the deposition rate tends to be greater at the corners, resulting in a feature having a reentrant profile. Another mechanism that results in re-entrant profiles on multi-layer features is related to oxidation effects. For example, if the sidewalls of a multi-layer stack containing a tungsten silicide layer in all but the base layer is oxidized, the edges of the tungsten silicide layer will oxidize much more rapidly than the other layers, resulting in a re-entrant sidewall profile. There are also several mechanisms, such as mask proximity effects, and etch effects, that are known to cause re-entrant profiles on single layer features. The differential etch rate that results from a doping gradient in a single layer is a well-known example of the latter phenomenon. Generally speaking, the greater the dopant level, the faster the etch rate.

If a raised feature has a re-entrant profile, any positive resist that is beneath the overhang created by the re-entrant profile cannot be exposed during the printing (exposure) prosess. Thus, the resist beneath the overhang will remain in place after developing. This is particularly problematic when a conductive layer that has been deposited over dielectrically-coated, re-entrant profile features must be selectively etched to form multiple portions of the conductive layer that must be detached and electrically decoupled from one another. The re-entrant profile may provide a path which shorts together several of the multiple portions of the conductive layer that should be electrically isolated from one another. FIGS. 1 to 3 demonstrate this problem.

FIG. 1 depicts a cross-sectional view of a pair of wordlines, 11A and 11B, within an integrated circuit. Both wordlines were formed by anisotropically etching through a stack which included a polysilicon layer 12, a refractory metal silicide layer 13, and a overlying dielectric layer 14. The conductive portion of each wordline 11 (i.e., the polysilicon layer 12 and the silicide layer 13) is insulated from the substrate 15 by a gate oxide layer 16. The upper surface and sidewalls of each wordline 11 is covered by a silicon dioxide layer 17 that was deposited via chemical vapor deposition. The silicon dioxide layer 17 has imparted a re-entrant profile to the sidewalls of the wordlines. The silicon dioxide layer 17 has been patterned so as to provide a contact opening to the substrate between the two wordlines 11. A conductivity-providing layer 18, which makes contact with the substrate 15 between the two wordlines has been deposited. The conductivity-providing layer 18 has been covered with a layer of positive photoresist 19, which has been selectively exposed to ultraviolet light (represented by arrows labeled hv) through a reticle 20 during a printing step. Exposed regions of photoresist 19E will be removed during developing, while unexposed regions of photoresist 19U will remain after developing.

Referring now to FIG. 2, the portion of the integrated circuit depicted in FIG. 1 has been subjected to a resist development process. It will be noticed that not only the desired mask pattern 21, which corresponds to the unexposed regions of photoresist 20U, has remained, but also a pair of photoresist stringers, 22A and 22B. The photoresist stringers 22A and 22B were not removed during developing because the photoresist within the recesses formed by the re-entrant profiles of the dielectrically coated wordlines 11 was not exposed.

Referring now to FIG. 3, the mask pattern 21 has been utilized to selectively etch the conductivity-providing layer 18, resulting in a conductive contact 31 and a pair of conductive stringers 32A and 32B, which run along the recess formed by the re-entrant profile of each of the dielectrically coated wordlines. It is not difficult to envision the problem which would be caused if multiple, isolated contacts were to be formed at intervals along the wordlines 11. Stringers similar to stringers 32A and 32B would also run along the recesses of the facing, re-entrant sidewalls of the wordlines 11. It would be impossible to isolate one contact from another, and all would be shorted together.

A problem similar to that caused by re-entrant profiles is caused by deep trenches or troughs. Trenches and troughs pose two problems which hamper proper exposure of positive photoresist. First, a trench or trough may have a depth that is great enough that light will be absorbed before it reaches the bottom thereof. Secondly, the depth of focus for many UV exposure tools is relatively shallow. Thus, when the light is in focus on an upper surface of a particular topography having trenches or troughs therein, it is most likely out of focus at the bottom of the trenches or troughs. Poorly focused exposure can also result in insufficient exposure, which results in residual photoresist remaining at the bottom of the troughs or trenches. FIGS. 4 through 6 demonstrate this problem.

FIG. 4 depicts a cross-sectional view of an in-process integrated circuit having a pair of dielectrically-coated wordlines 41A and 41B, over which has been deposited a thick insulative layer 42, the insulative layer 42 having a deep contact opening 43, or trough, which has been etched therethrough, the opening 43 being lined with a subsequently deposited conductivity-providing layer 44 that must be removed from the opening 43, the conductivity-providing layer 44 having been masked with positive photoresist 45, the photoresist having been selectively exposed to electromagnetic radiation (represented by arrows labeled hv) through a reticle 46 during a printing step. Exposed regions of photoresist 45E will be removed during developing, while unexposed regions of photoresist 45U will remain after developing.

Referring now to FIG. 5, the portion of the integrated circuit depicted in FIG. 4 has been subjected to a resist development process. It will be noticed that not only the desired mask pattern 51 has remained, but also some residual, unexposed photoresist 53 at the bottom of the contact opening 43. The photoresist remains at the bottom of the contact opening 43 because either the electromagnetic radiation employed was absorbed by photoresist in the upper portion of the contact opening 43, or because the radiation was out of focus near the bottom of the opening 43, resulting in inadequate exposure at those depths.

Referring now to FIG. 6, the mask patter 51 has been utilized to selectively etch the conductivity providing layer 44, resulting in an unwanted portion 61 of the conductivity-providing layer remaining at the bottom of the contact opening 43.

In order to eliminate unwanted residual resist in recesses beneath re-entrant sidewalls of raised features or at the bottoms of trenches and troughs, it is necessary to employ some type of auxiliary etch step subsequent to the development of the photoresist. An oxygen plasma etch following developing will effectively remove unwanted, undeveloped positive photoresist. However, both unwanted residual photoresist and mask portions of the photoresist are attacked by an oxygen plasma etch. This results in a narrowing of the mask, and results in a loss of critical dimension for features which are subsequently etched using the plasma-etched photoresist mask. A similar, less than satisfactory result may be obtained by developing the positive photoresist in a high-normality, basic (high pH) solution such as tetramethyl ammonium hydroxide (TMAH).

Therefore, a need exists for an integrated circuit etch process which can produce resist patterns having line and space dimensions which are less than 3 microns, and which, in turn, can produce semiconductor devices having high resolution etched patterns, without the formation of residual resist material and without requiring a subsequent residual resist removal process.

SUMMARY OF THE INVENTION

The process of the present invention meets the above-described existing needs for etching steps used in the manufacture of integrated circuits by producing photoresist patterns having line and space dimensions which are less than 3 microns. Such patterns may be employed to produce high-resolution etched patterns within the functional layers comprising those circuits. The process proceeds without the formation of unwanted residual photoresist material in deep trenches and troughs and in recesses along the sidewalls of raised features having re-entrant sidewall profiles. No auxiliary, critical dimension shrinking etch step is required to remove such residual photoresist in those locations.

The subject invention is directed to a process for etching in-process integrated circuits to form predetermined etch patterns therein. For a first embodiment of this invention, an in-process integrated circuit having both a plurality of elevated features with re-entrant sidewall profiles, and at least one conductivity-providing layer, which covers said elevated features, is provided. An etch mask pattern is then formed on the in-process circuit using negative photoresist as the mask material, said pattern covering certain portions of the conductivity-providing layer and exposing other portions of the conductivity-providing layer. The exposed portions of the conductivity-providing layer are then etched.

For a second embodiment of this invention, an in-process integrated circuit having both a plurality of trenches or troughs formed in the upper surface thereof, and at least one conductivity-providing layer, which covers lines the trenches or troughs, is provided. An etch mask pattern is then formed on the in-process circuit using negative photoresist as the mask material, said pattern covering certain portions of the conductivity-providing layer and exposing other portions of the conductivity-providing layer. The exposed portions of the conductivity-providing layer are then etched.

The term "conductivity-providing layer" is employed simply to acknowledge the fact that a layer may be in-situ doped during deposition, or it may be doped (and rendered conductive) subsequent to its deposition.

PREFERRED EMBODIMENT OF THE INVENTION

Figure 1:
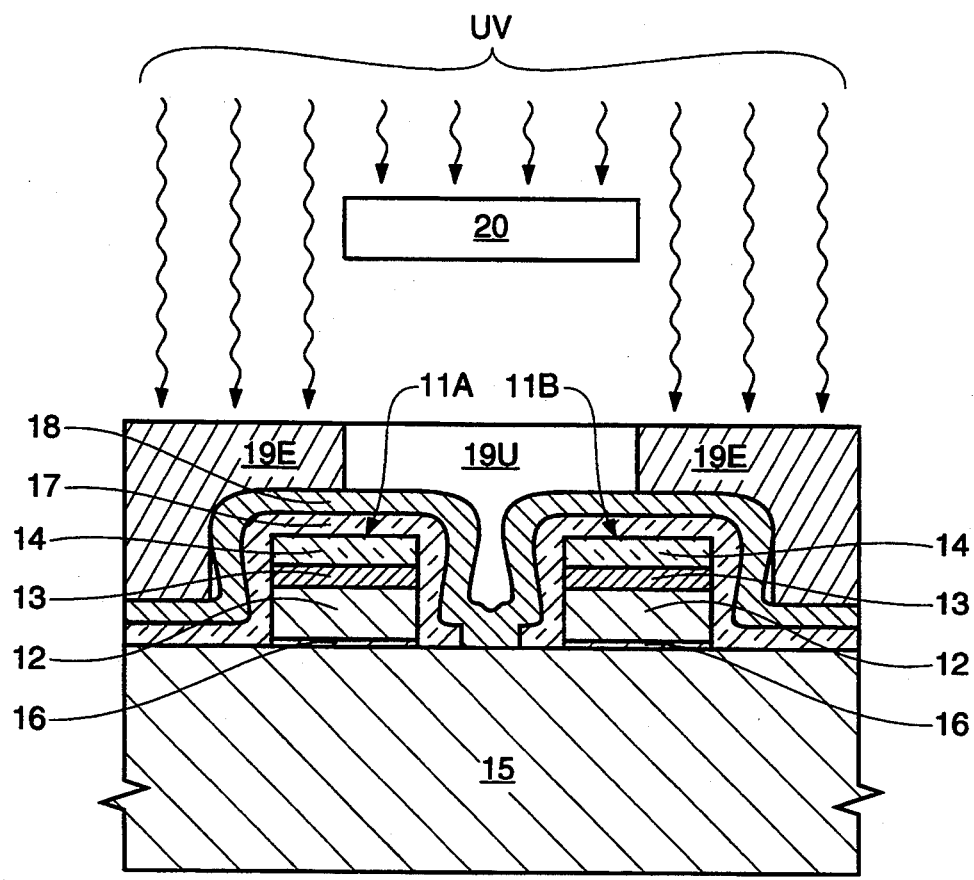
FIG. 1 is a cross-sectional view of an in-process integrated circuit, depicting a pair of dielectrically-coated wordlines having re-entrant sidewall profiles, and on which has been deposited a conductivity-providing layer, the latter having been masked with positive photoresist and selectively exposed to electromagnetic radiation during a printing step.
Figure 7:
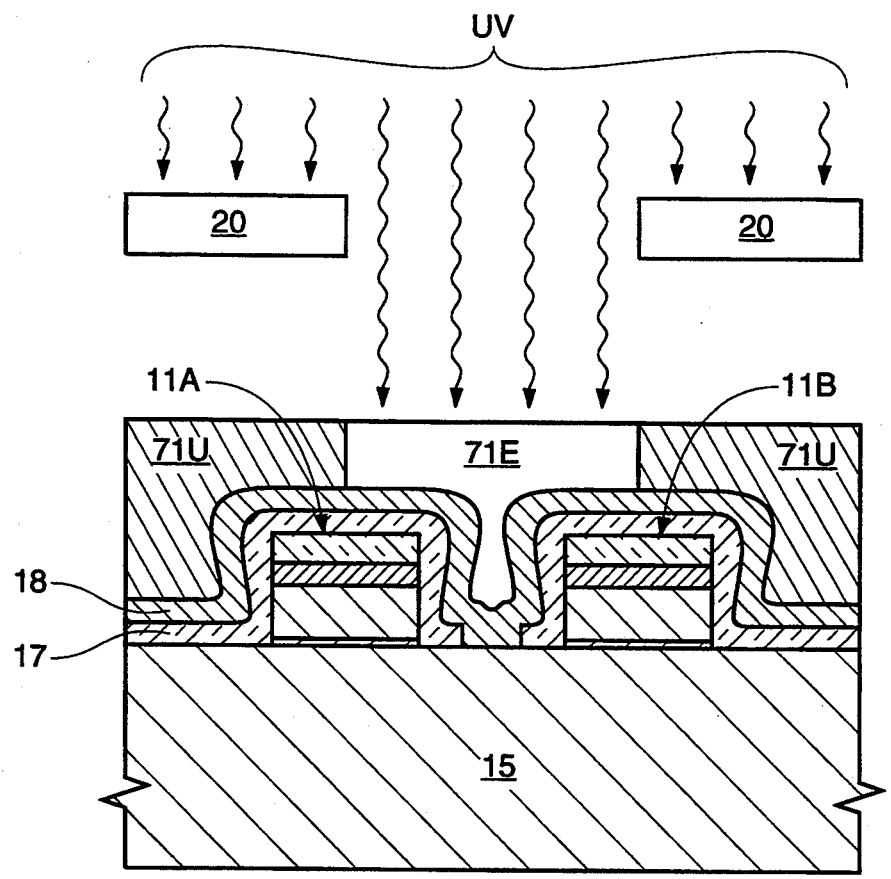
FIG. 7 is a cross-sectional view of an in-process integrated circuit, depicting a pair of dielectrically-coated wordlines having re-entrant sidewall profiles, and on which has been deposited a conductivity-providing layer, the latter having been masked with negative photoresist and selectively exposed to electromagnetic radiation during a printing step.

The in-process integrated circuit depicted in FIG. 7 is identical to that depicted in FIG. 1. Identical features are identified by identical numbers. However, in this case, the conductivity-providing layer 18 has been masked with negative photoresist 71, which has been selectively exposed to electromagnetic radiation during a printing step. The exposed negative photoresist is identified as 71E, while the unexposed negative photoresist is identified as 71U.

Figure 2:
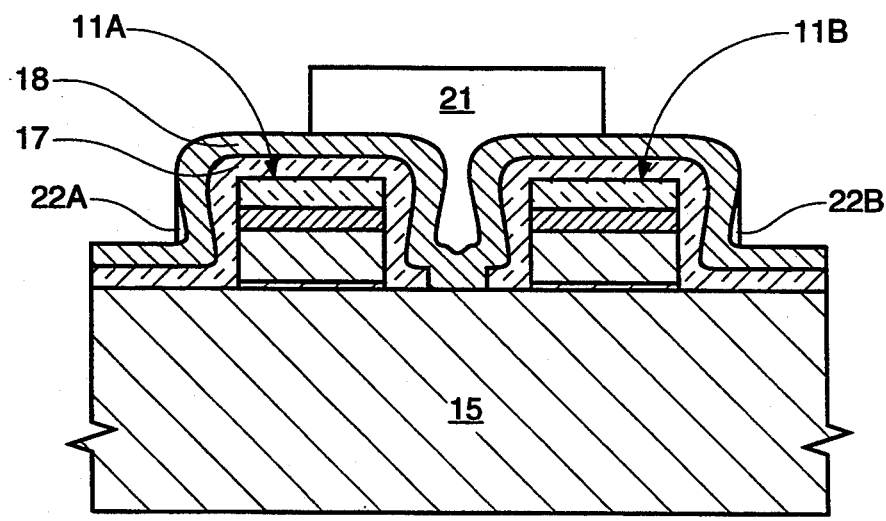
FIG. 2 is a cross-sectional view of the in-process integrated circuit of FIG. 1 following development of the selectively exposed positive photoresist.
Figure 3:
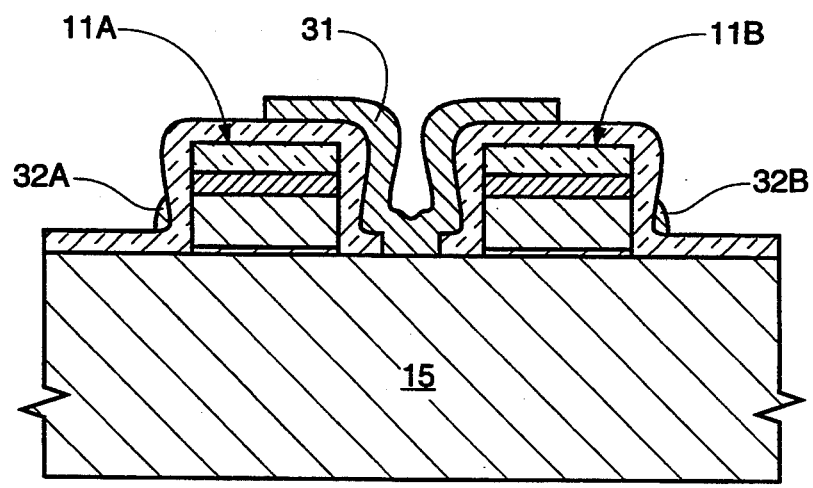
FIG. 3 is a cross-sectional view of the in-process integrated circuit of FIG. 2 following an etch of the conductivity-providing layer, and a subsequent photoresist strip.
Figure 8:
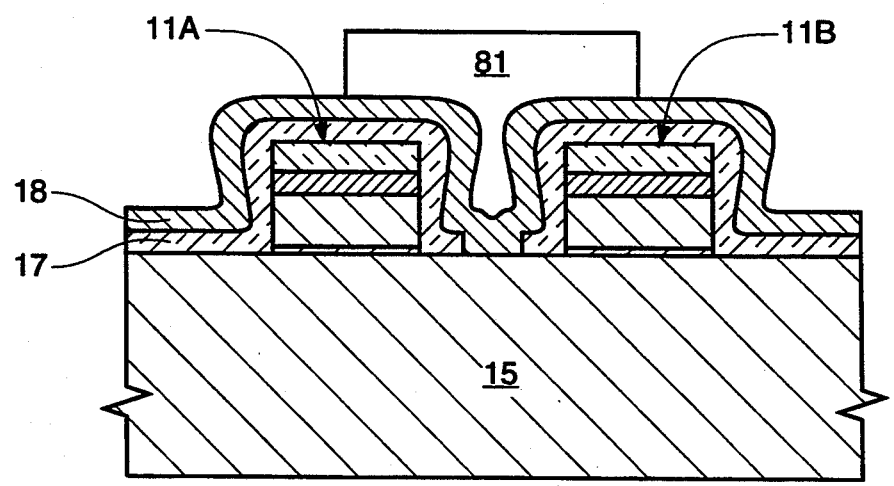
FIG. 8 is a cross-sectional view of the in-process integrated circuit of FIG. 7 following development of the selectively exposed negative photoresist.

Referring now to FIG. 8, the selectively exposed negative photoresist 71 has been developed, leaving a mask pattern that is essentially a reverse image of the mask depicted by FIG. 2. However, in this case, there is no residual photoresist remaining in the recesses created by the sidewalls of the re-entrant features.

Figure 9:
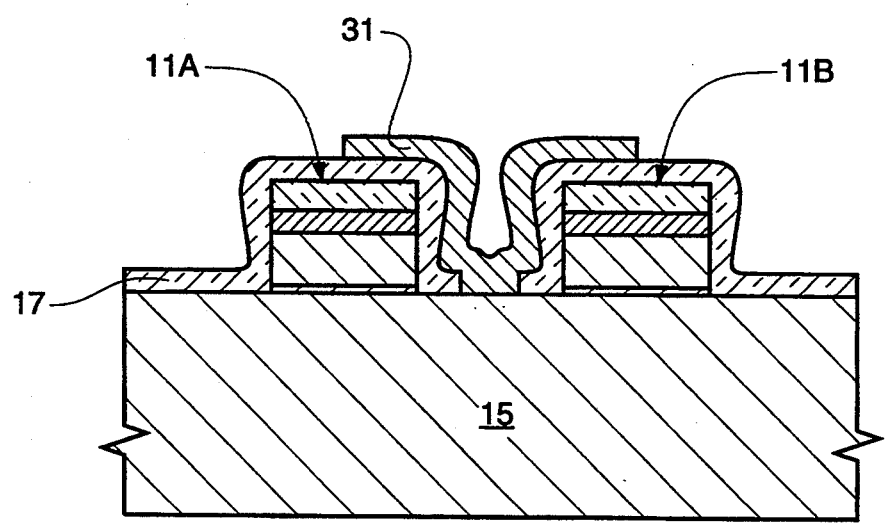
FIG. 9 is a cross-sectional view of the in-process integrated circuit of FIG. 8 following an etch of the conductivity-providing layer, and a subsequent photoresist strip.

Referring now to FIG. 9, following an etch of the conductivity-providing layer 18, and a subsequent photoresist strip, the desired pattern for the conductivity-providing layer remains. There is no conductive stringer problem with this new process, as with the use of positive resist.

Figure 4:
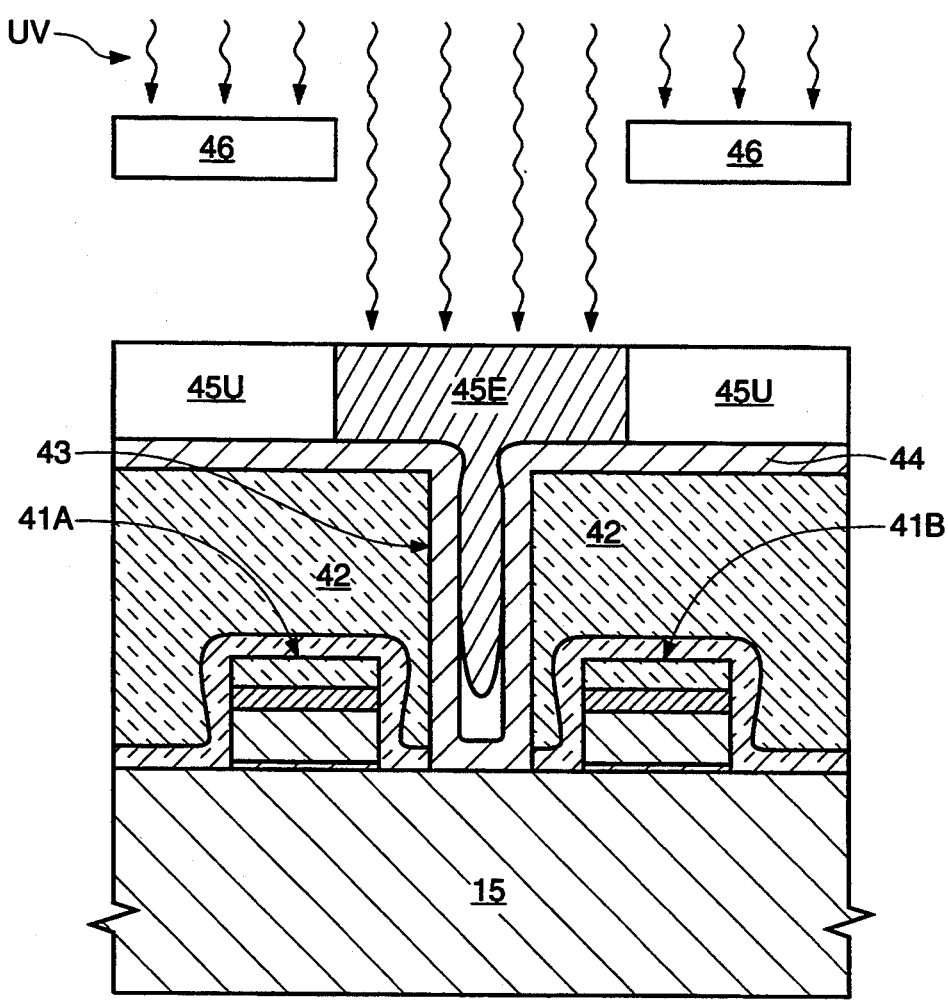
FIG. 4 is a cross-sectional view of an in-process integrated circuit, depicting a pair of dielectrically-coated wordlines, over which has been deposited a thick insulative layer, the insulative layer having a deep contact opening, or trough, which has been etched therethrough, the trough being lined with a subsequently deposited conductivity-providing layer that must be removed from the contact opening, the conductivity-providing layer having been masked with positive photoresist, the photoresist having been selectively exposed to electromagnetic radiation during a printing step.
Figure 10:
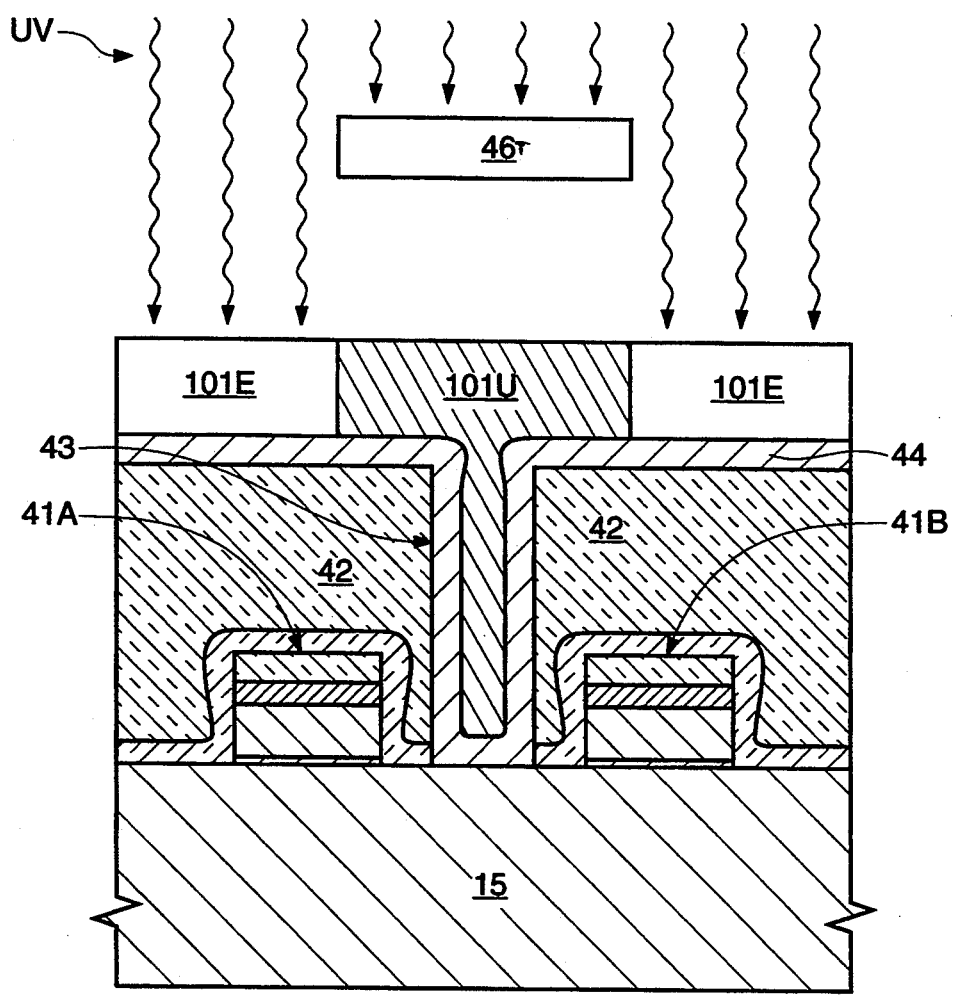
FIG. 10 is a cross-sectional view of an in-process integrated circuit, depicting a pair of dielectrically-coated wordlines, over which has been deposited a thick insulative layer, the insulative layer having a deep contact opening, or trough, which has been etched therethrough, the trough being lined with a subsequently deposited conductivity-providing layer that must be removed from the contact opening, the conductivity-providing layer having been masked with negative photoresist, the photoresist having been selectively exposed to electromagnetic radiation during a printing step.

The in-process integrated circuit depicted in FIG. 10 is identical to that depicted in FIG. 4. Identical features are identified by identical numbers. However, in this case, the conductivity-providing layer 44 has been masked with negative photoresist 101, which has been selectively exposed to electromagnetic radiation during a printing step. The exposed negative photoresist is identified as 101E, while the unexposed negative photoresist is identified as 101U.

Figure 5:
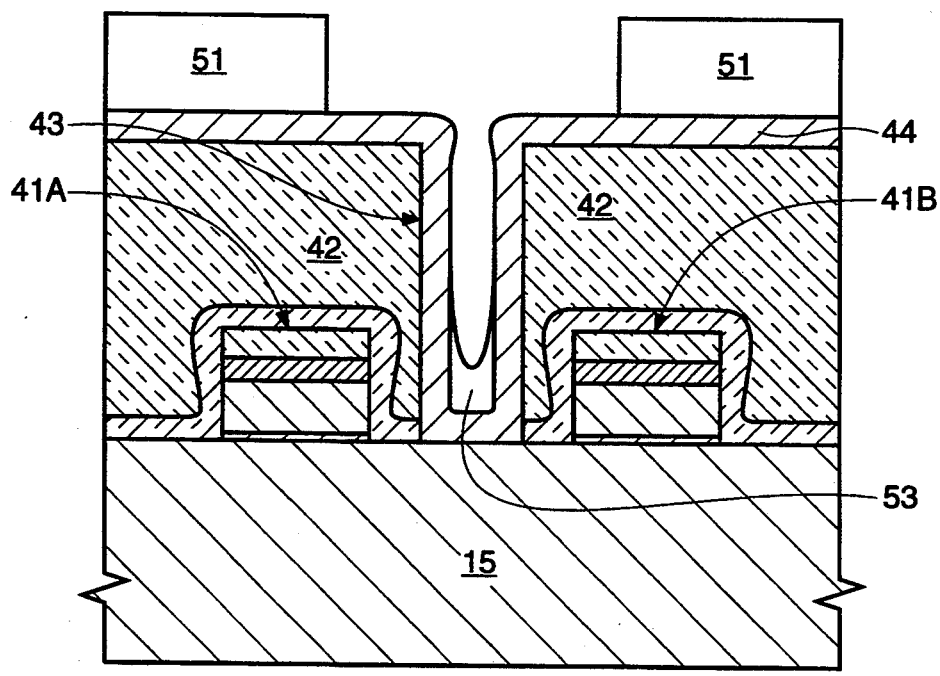
FIG. 5 is a cross-sectional view of the in-process integrated circuit of FIG. 4 following development of the selectively exposed positive photoresist.
Figure 6:
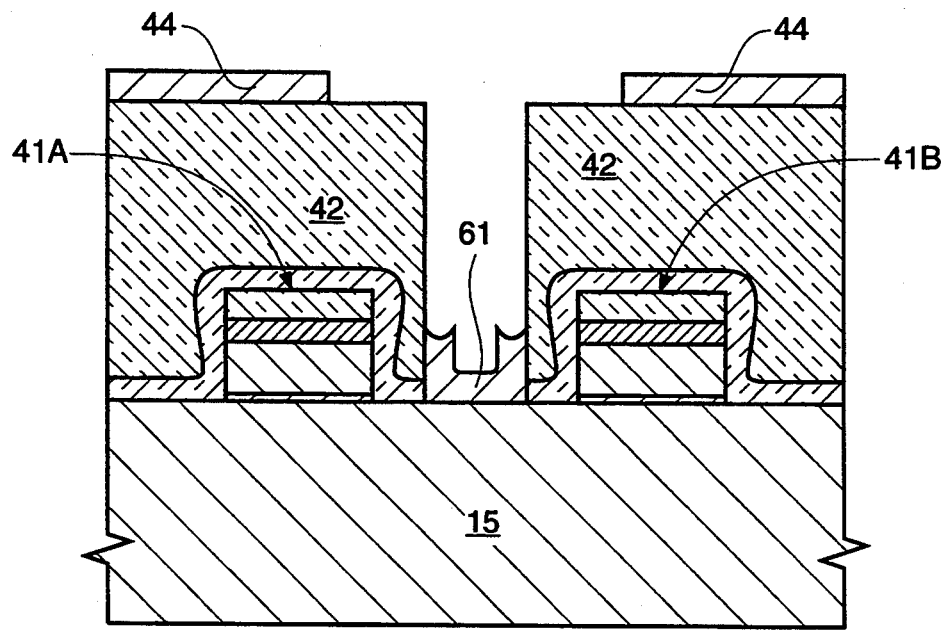
FIG. 6 is a cross-sectional view of the in-process integrated circuit of FIG. 5 following an etch of the conductivity-providing layer, and a subsequent photoresist strip.
Figure 11:
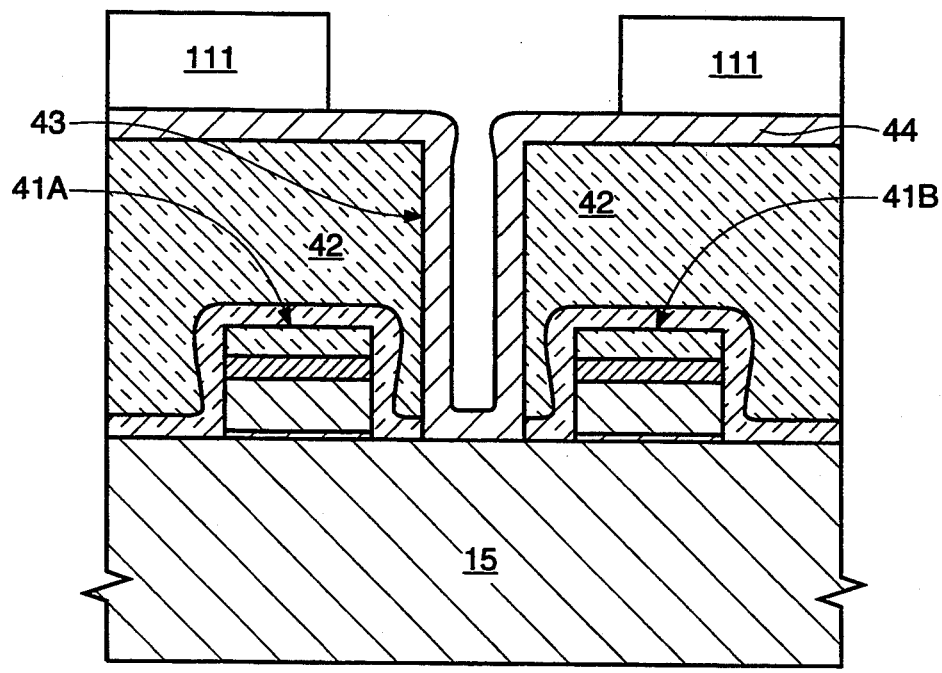
FIG. 11 is a cross-sectional view of the in-process integrated circuit of FIG. 10 following development of the selectively exposed negative photoresist.

Referring now to FIG. 11, the selectively exposed negative photoresist 101 has been developed, leaving a mask pattern that is essentially a reverse image of the mask depicted by FIG. 5. However, in this case, there is no residual photoresist remaining at the bottom of the contact opening 43.

Figure 12:
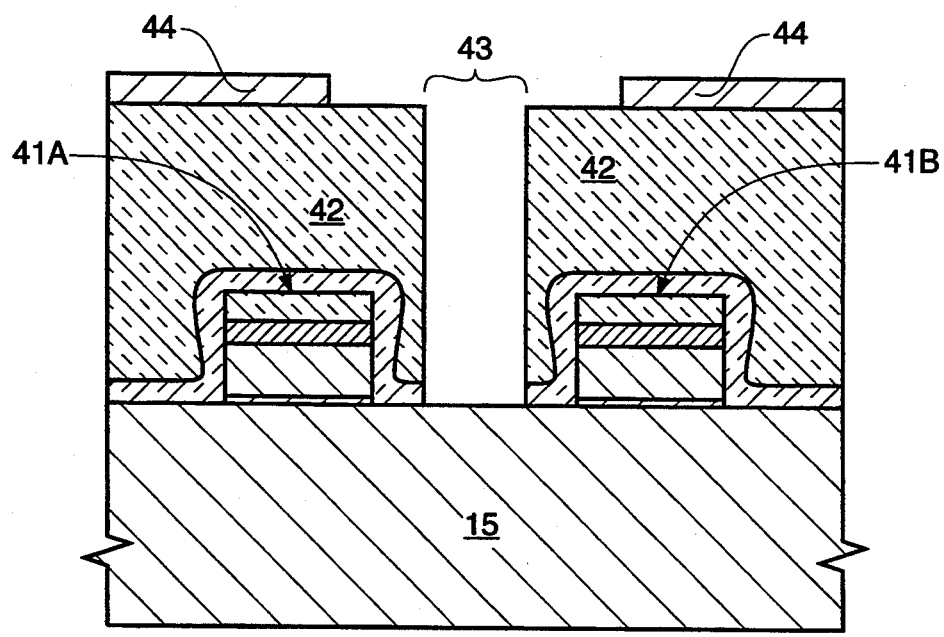
FIG. 12 is a cross-sectional view of the in-process integrated circuit of FIG. 11 following an etch of the conductivity-providing layer, and a subsequent photoresist strip.

Referring now to FIG. 12, following an etch of the conductivity-providing layer 44, and a subsequent photoresist strip, the desired pattern for the conductivity-providing layer remains. There is no portion of the conductivity-providing layer remaining at the bottom of the contact opening 43.

Thus, it can be clearly seen that the process of the present invention provides superior etching results when an in-process integrated circuit has either features with re-entrant sidewall profiles or deep trenches or troughs. The process is particularly useful in combination with new negative-type resists that are capable of use on structures having feature widths and spaces of less than 3 microns. Although a first embodiment of the invention has been described in the context of re-entrant profiles on the dielectrically-coated sidewalls of wordlines in a memory circuit, the invention is applicable to any re-entrant profile, whether caused by uneven etch rates, unequal deposition rates or any other cause. Likewise, although a second embodiment of the invention was described in the context of deep contact openings, it is equally applicable to masking over deep trenches in a substrate or deep troughs created in a layer formed on a substrate. Although the invention is described in terms of exposure of negative photoresist to ultraviolet light, it is by no means intended that the process be limited to the use of only ultraviolet light. Any electromagnetic radiation appropriate for exposing the particular negative photoresist is contemplated. The use of phase-shifting reticles, which provide enhanced resolution for a given wavelength, is also contemplated.

Although only several embodiments of this invention have been disclosed herein, it will be obvious to those having ordinary skill in the art of integrated circuit manufacture that changes and modifications may be made thereto without departing from the spirit and the scope of the invention as hereinafter claimed.

What is claimed is:

1. An etch process for use in the manufacture of integrated circuit devices which eliminates the formation of conductive stringers adjacent elevated features having re-entrant profiles, said process comprising the steps of:
   (a) providing an in-process integrated circuit having both a plurality of elevated features with re-entrant sidewall profiles, and at least one conductivity-providing layer, which covers said elevated features;
   (b) forming an etch mask pattern on said in-process circuit using negative photoresist material as the mask material, said pattern covering certain portions of the conductivity-providing layer and exposing other portions of the conductivity-providing layer; and
   (c) etching the exposed portions of the conductivity-providing layer.

2. An etch process for use in the manufacture of an integrated circuit comprising the steps of:
   (a) providing an in-process semiconductor wafer on which have been formed a plurality of superjacent primary structural layers, at least one of which has been etched in selected regions to form elevated features which have acquired reentrant sidewall profiles during processing;
   (b) forming a secondary layer which, when patterned, will serve a conductive function in the circuit, said secondary layer covering said elevated features;
   (c) forming an etch mask pattern on said secondary layer with negative photoresist, said pattern covering certain portions of the conductive layer, and exposing other portions of the conductive layer; and
   (d) etching exposed portions of said secondary layer.

3. The process of claim 2, wherein said etch mask pattern comprises at least one mask feature having one or more lateral dimension of less than 2 microns.

4. The process of claim 2, wherein said etch mask pattern comprises at least one mask feature having one or more lateral dimension of less than 1 micron.

5. The process of claim 2, wherein said etch mask pattern comprises at least one mask feature having one or more lateral dimension of less than ½ micron.

6. The process of claim 2, wherein said etch mask pattern comprises mask features, with adjacent mask features being separated by a space that is less than 2 microns in a lateral direction.

7. The process of claim 2, wherein said etch mask pattern comprises mask features, with adjacent mask features being separated by a space that is less than 1 micron in a lateral direction.

8. The process of claim 2, wherein said etch mask pattern comprises mask features, with adjacent mask features being separated by a space that is less than ½ micron in a lateral direction.

9. An etch process for use in the manufacture of dynamic random access memories of stacked capacitor design, said process comprising the steps of:
   (a) providing an in-process dynamic random access memory constructed on a substrate, which has been subjected to deposition and etching steps in order to form a plurality of generally parallel wordlines which are coated with a dielectric layer, said coated wordlines having re-entrant sidewall profiles;

(b) depositing a conductivity-providing layer over the coated wordlines;

(c) forming an etch mask pattern on said in-process memory, said pattern covering certain portions of the conductivity-providing layer, and exposing other portions of the conductivity-providing layer; and (d) etching the exposed portions of the conductivity-providing layer.

10. An etch process for use in the manufacture of integrated circuits, said process comprising the steps of:

(a) providing an in-process integrated circuit constructed on a semiconductor substrate, said in-process integrated circuit having a plurality of elevated features which have been etched from a stack of structural layers which were formed on said substrate, said features having been subjected to processing which has endowed them with re-entrant sidewall profiles;

(b) forming an etch mask pattern on said in-process integrated circuit with negative photoresist material, said pattern covering certain portions of the in-process circuit, and exposing other portions thereof; and (c) etching the exposed portions of the in-process circuit.

11. The process of claim 10, wherein said etch mask pattern comprises at least one mask feature having one or more lateral dimension of less than 2 microns.

12. The process of claim 10, wherein said etch mask pattern comprises at least one mask feature having one or more lateral dimension of less than 1 micron.

13. The process of claim 10, wherein said etch mask pattern comprises at least one mask feature having one or more lateral dimension of less than ½ micron.

14. The process of claim 10, wherein said etch mask pattern comprises mask features, with adjacent mask features being separated by a space that is less than 2 microns in a lateral direction.

15. The process of claim 10, wherein said etch mask pattern comprises mask features, with adjacent mask features being separated by a space that is less than 1 micron in a lateral direction.

16. The process of claim 10, wherein said etch mask pattern comprises mask features, with adjacent mask features being separated by a space that is less than ½ micron in a lateral direction.

17. An etch process for use in the manufacture of integrated circuits comprising the steps of:

(a) providing an in-process semiconductor wafer on which have been formed a plurality of primary structural layers, said primary structural layers having been etched in selected regions to form a wafer topography comprising elevated features and recessed regions, said elevated features having acquired re-entrant sidewall profiles during previous processing steps;

(b) forming a secondary structural layer, which covers said elevated features;

(c) forming an etch mask pattern on said wafer with negative photoresist, said pattern covering certain portions of said secondary structural layer, and exposing other portions of said secondary structural layer; and (d) etching exposed portions of the secondary layer.

18. The process of claim 17, wherein the shortest lateral distance between adjacent features is less than two-thirds the average height of said adjacent features above the recessed regions.

19. The process of claim 17, wherein the shortest lateral distance between adjacent features is less than half the average height of said adjacent features above the recessed regions.

20. The process of claim 17, wherein the shortest lateral distance between adjacent features is less than one-third the average height of said adjacent features above the recessed regions.

21. An etch process for use in the manufacture of an integrated circuit comprising the steps of:

(a) providing an in-process semiconductor wafer on which have been sequentially formed a plurality of structural layers, said plurality of structural layers including a polycrystalline silicon (poly) layer, a metal silicide layer superjacent the polycrystalline silicon layer, and a silicon dioxide (oxide) layer superjacent the metal silicide layer, said plurality of structural layers having been selectively etched such that the edges of the poly, silicide, and oxide layers were simultaneously exposed to an etching environment in order to form elevated poly-silicide-oxide sandwich features;

(b) forming a dielectric coating at the edges of at least the exposed edges of the poly layer and the silicide layer, said dielectric coating endowing each feature with a re-entrant sidewall profile;

(c) depositing a conductivity-providing layer, which blankets the wafer;

(d) forming an etch mask pattern on said wafer with negative photoresist, said pattern covering certain portions of the conductivity-providing layer, and exposing other portions of the conductivity-providing layer; and (e) etching exposed portions of the conductivity-providing layer.

22. The process of claim 21, wherein said dielectric coating is formed by exposing the edges of the poly layer and the silicide layer to an oxidizing environment which converts silicon near the edge of each layer to silicon dioxide.

23. The process of claim 21, wherein said dielectric coating is formed using chemical vapor deposition.

24. The process of claim 21, wherein said dielectric coating is formed using plasma-enhanced chemical vapor deposition.

* * * * *